United States Patent [19]

Weiner

[11] Patent Number: 5,696,478
[45] Date of Patent: Dec. 9, 1997

[54] SOLDERING PIN, ESPECIALLY FOR USE IN A COIL FORMER

[76] Inventor: Rene Weiner, Paulstrasse 5, 51702 Bergneustadt, Germany

[21] Appl. No.: 680,625

[22] Filed: Jul. 17, 1996

[30] Foreign Application Priority Data

Jul. 31, 1995 [DE] Germany .................. 295 12 324 U

[51] Int. Cl.$^6$ .................. H01F 27/29; H01F 27/30
[52] U.S. Cl. .................. 336/192; 336/192; 336/198; 336/208
[58] Field of Search ................ 336/208, 198, 336/192; 174/138 G, 138 E; 361/767, 770, 742, 807, 808

[56] References Cited

U.S. PATENT DOCUMENTS 3,496,505  2/1970  Johannsen et al. .............. 336/208
3,524,156  8/1970  Horbach ........................ 336/208
5,281,942  1/1994  Stokes .......................... 336/198

FOREIGN PATENT DOCUMENTS 61-47611  3/1986  Japan ........................... 336/198
2250864   6/1992  United Kingdom ................. 336/192

*Primary Examiner*—Michael L. Gellner
*Assistant Examiner*—Anh Mai
*Attorney, Agent, or Firm*—Howard & Howard

[57] ABSTRACT

A soldering pin has a periphery defined by two straight line planar sides, and two arc-shaped sides. The planar sides allow gas to escape, while the arc-shaped sides ensure a solid connection. Fluting is provided on the arc-shaped sides.

14 Claims, 1 Drawing Sheet

SOLDERING PIN, ESPECIALLY FOR USE IN A COIL FORMER

BACKGROUND OF THE INVENTION

The invention relates to a soldering pin, especially for use in a coil former. The soldering pin preferably has an elongate body of conductive material. An end section of the soldering pin is adapted to be soldered into a receiving opening of a printed circuit board. The pin also has at least one further section for receiving a wire wound about this section.

This general type of soldering pin is known, e.g., from the German layed-open print 39 36 110 A1. The elongate body of this prior soldering pin is essentially rectangular.

The prior art further discloses soldering pins having an essentially cylindrical body. A cylindrical shape has the disadvantage that when the pin is being soldered into the receiving opening in a printed circuit board, escaping gases may push the pin out of the receiving opening.

An advantage of a regular shape over the cylindrical shape consists in that the gases generated during soldering can easily escape between the receiving opening and the side faces of the rectangular pin. Further, a pin having a rectangular shape has the advantage that the edges can be used as tear edges when winding a wire about the pin. The edges also reduce soldering times since the coating of enamelled wire is worn off at the edges. A disadvantage of the rectangular pin consists in that the pin contacts the receiving opening at best in only four points. This increases the risk of tearing the edge of the receiving opening, especially when the receiving opening is formed from brittle plastic materials. The overall stability of the rectangular pin is lower than that of a cylindrical pin.

SUMMARY OF THE INVENTION

It is the object of the invention to provide a soldering pin which has a high positional stability in the receiving opening and which ensures good soldering characteristics.

These objects are achieved for a soldering pin of the above-mentioned type by providing that at least the end section has approximately the same cross-section along the axial direction, with the periphery of the cross-section defined by two straight lines lying opposite each other and connected by arc-shaped boundary lines. Preferably, the side faces of the end section which contain the arc-shaped boundary lines are provided with a fluting.

In the soldering pin of the invention, the arc-shaped side faces enable a stable mounting of the soldering pin in a receiving opening. The plane surfaces containing the straight lines lying opposite each other, allow the gas generated during soldering to easily escape without pushing the soldering pin out of the receiving opening.

The fluting further increases the stability of the soldering pin in the receiving opening. The plastic material which is in contact with the soldering pin melts when soldering is carried out at a temperature of about 300° C., and penetrates into the fluted surfaces. In the region of the fluted surfaces, a positive connection is thus created between the soldering pin and the printed circuit board. This connection increases the resistance of the soldering pin against being pulled out.

Further, when soldering the soldering pin to a connecting path, the fluting increases the contacting surface due to the fact that the solder can flow into the gap between the receiving opening and the soldering pin.

The invention further relates to a coil former having a central part for receiving a winding. The coil former has at least one connecting ledge for receiving at least one soldering pin having an elongate body of a conductive material and having an end section adapted to be soldered into a receiving opening of a printed circuit board. The soldering pin has at least one further section for receiving. The coil former is characterized in that at least the end section of the soldering pin has approximately the same cross-section along the axial direction, wherein the periphery of said cross-section is defined by two straight lines lying opposite each other and connected by arc-shaped boundary lines. Preferably, the side faces of the end section which contain the arc-shaped boundary lines are provided with a fluting.

The use of soldering pins of the above-mentioned type increases the stability of the coil former on the printed circuit board.

BRIEF DESCRIPTION OF THE DRAWINGS

An embodiment of the invention will now be described with reference to the accompanying drawings, wherein.

DETAILED DESCRIPTION OF THE DRAWINGS

Figure 1:
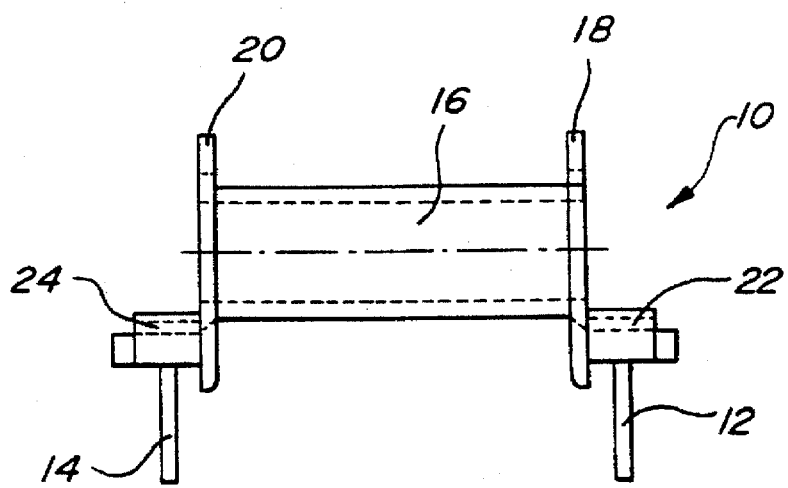
FIG. 1 is a view of a coil former having soldering pins.

FIG. 1 shows a coil former 10 having soldering pins 12 and 14. The coil former 10 has a central part 16 for receiving wire windings, not shown. The central part 16 is delimited by flanges 18 and 20 which are provided for preventing the wire windings (not shown) from slipping off the central part 16. Connecting ledges 22 and 24 are formed on said flanges. Each of the connecting ledges receive a series of soldering pins. Only the soldering pins 12 and 14 are shown in FIG. 1.

The ends of the wire windings are wound about the soldering pins 12 and 14 and/or soldered to the pins (not shown in FIG. 1) in the region below the connecting ledges 22 and 24. The free ends of the soldering pins 12 and 14 serve for mounting the coil former 10 to a printed circuit board (not shown). The soldering pins 12 and 14 are usually soldered to conducting paths on the printed circuit board.

Figure 2:
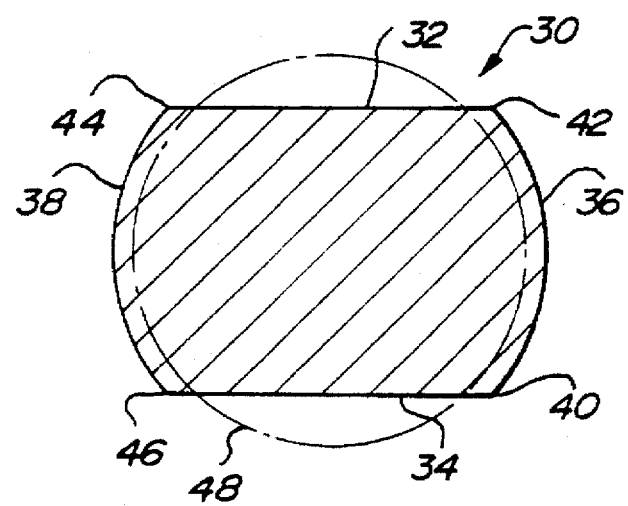
FIG. 2 is a view of a cross-section of a soldering pin.

FIG. 2 shows a cross-section 30 of the soldering pin 12 or 14 and the invention. Two straight line sides 32 and 34 lien opposite each other. Two arc-shaped boundary line sides 36 and 38 complete the periphery of the cross-section 30. The arc-shaped boundary lines are circular arcs having the same radius and preferably having coincident centers. At the points of contact between the straight lines 32 and 34 and the arc-shaped boundary lines 36 and 38, sharp edges 40 to 46 are formed. Edges 40 to 46 are sufficiently sharp in spite of the arc-shaped boundary lines 36 and 38 to allow tearing off a wire when winding it about the pin.

FIG. 2 shows in a broken line the diameter 48 of a receiving opening formed in the printed circuit board (not shown). The diameter 48 is smaller than the outer diameter of the soldering pins 12 and 14 at sides 36 and 38. Thus, slight pressure has to be exerted to introduce the pins into the receiving opening. The soldering pin is then securely held in the receiving opening and cannot be pushed out of the receiving opening by gases generated during soldering.

Figure 3:
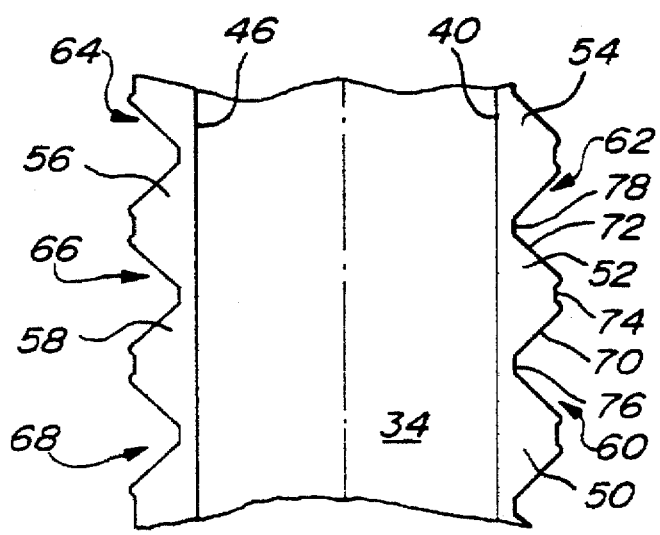
FIG. 3 is a side view of the soldering pin.

FIG. 3 shows a side view of the end sections of the soldering pins 12 and 14, respectively. The fluting of the side faces is clearly visible. The fluting is formed by projections 50 to 58, with grooves 60 to 68 formed between said projections. Projections 50–58 define an outer diameter greater than diameter 48, while grooves 60–68 having a diameter less than 48. Flanks 70 and 72 of the projection 52 are essentially perpendicular to each other. The projection 52 has a head surface 74 and is delimited in the longitudinal direction of the soldering pin by groove bottom surfaces 76 and 78.

The projections 50 to 54 and the grooves 60 and 62 are offset with respect to the projections 56 and 58 and the grooves 64 to 68 of the respective opposite side face in such a way that each projection head surface is lying opposite a groove bottom surface. This arrangement facilitates winding the end of a wire about the pin.

I claim:

1. A soldering pin especially for use in a coil former comprising:
    an elongate body of a conductive material and having an end section adapted to be soldered into the receiving opening of a printed circuit board, said body having at least one further section for receiving a wound wire, the periphery of said end-section defined by two straight line sides lying opposite each other and connected by arc-shaped boundary line sides and said arc-shaped boundary line sides provided with a fluting.

2. A soldering pin according to claim 1, wherein said body has a constant cross-section along its entire length.

3. A soldering pin according to claim 1, wherein edge ends are formed where the sides containing the are-shaped boundary lines merge into the straight line sides, said edge ends serving as tear edges when winding a wire about the soldering pin.

4. A soldering pin according to claim 1, wherein said arc-shaped boundary line sides are circular arcs having the same radius and having coinciding centers.

5. A soldering pin according to claim 4, wherein said arc-shaped boundary line sides form portions of a cylindrical surface.

6. A soldering pin according to claim 4, wherein said fluting is formed by grooves having an inner diameter smaller than the diameter of the receiving opening in the printed circuit board and having an outer diameter larger than the diameter of the receiving opening in the printed circuit board.

7. A soldering pin according to claim 1, wherein said flutings of opposed sides are offset relative to each other in the axial direction.

8. A coil former comprising:
    a body having a central part for receiving a winding, said coil former having at least one connecting ledge for receiving at least one soldering pin;
    a soldering pin received in said connecting ledge and having an elongate body of conductive material and an end section adapted to be soldered into a receiving opening of a printed circuit board, said soldering pin having at least one further section for receiving a wound wire said end section having approximately the same cross-section along the axial direction, and the periphery of said cross-section being defined by two straight line sides lying opposite each other and connected by arc-shaped boundary line sides and said arc-shaped boundary line sides provided with a fluting.

9. A coil former according to claim 8, wherein said body has the cross-section of said end section along its entire length.

10. A coil former according to claim 8, wherein edge ends are formed where the sides containing the arc-shaped boundary line sides merge into the straight line sides, said edge ends serving as tear edges when winding a wire about the soldering pin.

11. A coil former according to claim 8, said arc-shaped boundary line sides are circular arcs having the same radius and having coinciding centers.

12. A coil former according to claim 8, wherein said arc-shaped boundary line sides form portions of a cylindrical surface.

13. A coil former according to claim 8, wherein said fluting is formed by grooves having an inner diameter smaller than the diameter of the receiving opening in the printed circuit board and having an outer diameter larger than the diameter of the receiving opening in the printed circuit board.

14. A coil former according to claim 8, said flutings of opposed sides are offset relative to each other in the axial direction.

* * * * *